(12) United States Patent
Kono

(10) Patent No.: US 6,788,105 B2
(45) Date of Patent: Sep. 7, 2004

(54) SEMICONDUCTOR INTEGRATED CIRCUIT

(75) Inventor: Ichiro Kono, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 6 days.

(21) Appl. No.: 09/931,878

(22) Filed: Aug. 20, 2001

(65) Prior Publication Data

US 2002/0057108 A1 May 16, 2002

(30) Foreign Application Priority Data

Nov. 13, 2000 (JP) ........................................ 2000-350553

(51) Int. Cl.⁷ ...................... H03K 19/173; G01R 31/28
(52) U.S. Cl. ........................... 326/46; 326/16; 327/202; 714/726
(58) Field of Search ................................ 326/38, 46, 82, 326/16; 327/185, 202, 212; 714/30, 726, 729

(56) References Cited

U.S. PATENT DOCUMENTS 5,015,875 A * 5/1991 Giles et al. ............... 307/272.2
5,444,404 A * 8/1995 Ebzery ........................ 327/185
5,633,606 A * 5/1997 Gaudet et al. ............... 327/202
6,047,386 A * 4/2000 Sanghani et al. ............. 714/30

OTHER PUBLICATIONS

K–T Cheng et al. "Current Directions in Automatic Test Pattern Generation", *IEEE Computer*, vol. 32, No. 11, Nov. 1999, pp. 58–64.

B. Nadeau–Dostie, *Design For At–Speed Test, Diagnosis and Measurement*, Kluwer Academic Publishers, 1999, p. 24.

J. H. Stewart et al., "Application of SCAN/SET for Error Detection and Diagnostics", Digest of Papers, 1978 Semiconductor Test Conference, pp. 152–158.

* cited by examiner

*Primary Examiner*—Daniel D. Chang
(74) *Attorney, Agent, or Firm*—Miles & Stockbridge P.C.

(57) ABSTRACT

A 2-input AND gate is inserted between an output terminal of a scan flipflop with an input selectable gate and a logic output signal line. The 2-input AND gate is controlled by a scan-enable signal line, and has a role to fix the transition of the output signal of the scan flipflop.

5 Claims, 20 Drawing Sheets

SEMICONDUCTOR INTEGRATED CIRCUIT

BACKGROUND OF THE INVENTION

The present invention relates to a semiconductor integrated circuit, and in particular, to a semiconductor integrated circuit mounting a logic circuit including a storage element.

In order to detect the stuck-at fault and the like with respect to the logic circuit, the method of scanning a logic circuit is widely used. This method provides the advantage in which the fault can be efficiently detected. Because, when this method is used, it becomes possible to directly manipulate the value of the flipflop (hereinafter, referred to as "FF") within the logic circuit.

The process of detecting (hereinafter, referred to as "testing") the fault with respect to the scanned logic circuit will be explained with reference to the drawings. FIG. 22 is the circuit configuration diagram showing the scan FF used in the conventional technique. This is an example of the multiplexer-type scan FF (hereinafter, referred to as "MUX-type scan FF"). In this configuration, a multiplexer (hereinafter, referred to as "MUX") g2602 is connected to an input terminal D of a FF g2601. A signal (hereinafter, referred to as "input signal from logic circuit" or "logic input signal") for performing a normal operation at a front stage is applied through a logic input signal line to the MUX g2602 from a group of logic gates (hereinafter, referred to as "user logic circuit"). Furthermore, a signal for the scan (hereinafter, referred to as "scan-in signal") from a FF at the front stage is input through a scan-in signal line. Furthermore, a signal (hereinafter, referred to as "scan-enable signal") for controlling to change over which the FF g2601 fetches the logic input signal or the scan-in signal is input through a scan-enable signal line. A logic output signal line for propagating a signal (hereinafter, referred to as "output signal to logic circuit" or "logic output signal") which is input to a user logic circuit at the rear stage, and a scan-out signal line for propagating a signal for scan (hereinafter, referred to as "scan-out signal") which is input to a FF at the rear stage are branched in the fork-shape and are connected to an output terminal Q of the FF g2601.

FIG. 23 is a diagram showing a logic circuit scanned by the conventional technique. This is an example of the scanned logic circuit formed by connecting the MUX-type scan FFs in multi-stages. In this configuration, the scan-out signal lines of the MUX-type scan FFs g2701 and g2702 are respectively connected to the scan-in signal lines of the MUX-type scan FFs g2702 and g2703 to form the signal paths of logic circuit (hereinafter, referred to as "paths"). Hereinafter, these paths are referred to as "scan paths". Also, the scan-in signal line of the MUX-type scan FF g2701 is connected to the terminal (scan-in terminal) which receives the scan-in signal from the outside of the semiconductor integrated circuit chip (hereinafter, referred to as "chip"). The scan-out signal line of the MUX-type scan FF g2703 is connected to the terminal (scan-out terminal) which outputs the scan-out signal to the outside of the chip.

The test using the scan FF is conducted by sequentially repeating the following operations.

(1) An operation for substituting the initial values for test into the respective FFs within the logic circuit (hereinafter, referred to as "scan-in operation");
(2) An operation for inputting the initial values into the user logic circuits from the respective FFs to fetch into the respective FFs the test result values which are output from the user logic circuits (hereinafter, referred to as "logic test operation"); and
(3) An operation for collecting the test result values from the respective FFs (hereinafter, referred to as "scan-out operation").

The reference numerals a2704, a2705 and a2706 denote the signal flow at scan-in operation, the signal flow at logic test operation and the signal flow at scan-out operation, respectively.

FIG. 24 is a timing chart showing the operation of the scan FF g2603 used in the conventional technique. First, at scan-in operation, the scan-enable signal is set to "High" so that the respective FFs can fetch the scan-in signal. In order to substitute the initial values for test into the respective FFs, the clock signal is made to transit (s2801) a plurality of times to carry out the shift operation through the scan path. Next, at logic test operation, the scan-enable signal is set to "Low" (s2802) so that the respective FFs can fetch the logic output signals. In order to input the initial values for test into the user logic circuits, the clock signal is made to transit one time, and in order to fetch the test result values into the respective FFs, the clock signal is made to transit one time (s2803). Moreover, at scan-out operation, in order that the respective FFs can output the scan-out signals, the scan-enable signal is set again to "High" (s2804). In order to collect the test result values from the respective FFs, the shift operation similar to the scan-in operation is performed.

However, at scan-in and scan-out operations (hereinafter, referred to as "scan-mode operation" altogether), there is a trend that the probability of operating a logic circuit is usually increased as compared with at user-mode operation. For this reason, the fault detection mistakes due to the excessive voltage drops and the fear of the chip destruction due to the heat generation have been pointed out as the devices become finer, as described in IEEE Computer, vol.32, no.11, p.61, 1999, for example.

In order to avoid this problem, heretofore, it is considered to suppress the power consumption by reducing the frequency at scan-mode operation, as described in DESIGN FOR AT-SPEED TEST, DIAGNOSIS AND MEASUREMENT, Kluwer Academic Publishers, p. 24, 1999, for example. According to this conventional technique, as shown in FIG. 24, the frequency of the system clock signal at logic test operation (s2803) is made to be the frequency at normal operation of the user logic circuit. Whereas, the frequency of the system clock signal at scan-mode operation (s2801) is lowered to reduce the power consumption due to the operation of the user logic circuit at scan-in operation. However, in this method, the time required for the test (test time) becomes long, so that the advantage due to scan will be deteriorated. This is because that the time required for the scan-mode operation normally occupies the most part of the whole test time. As a result, the cost required for the test (hereinafter, referred to as "test cost") will be increased.

Furthermore, it is considered to reduce the power consumption at scan-mode operation by adding a FF, which is dedicated for the scan-mode operation, within the chip, as described in Digest of Papers 1978 Semiconductor Test Conference, pp. 152–158, for example. However, in this method, the area of the chip will be increased to a great extent. In this respect, according to our inventors' study, it is found that the chip area increases by about 50% as compared with the normal condition.

As mentioned above, in the conventional technique, there is a problem in that when it is intended to detect the fault with respect to the scanned logic circuit, the time required for the test becomes long, or the area of the chip increases to a great extent.

SUMMARY OF THE INVENTION

An object of the present invention is to provide a semiconductor integrated circuit capable of decreasing the test cost as compared with the conventional technique by reducing the test time and by suppressing the increase of the chip area.

Another object of the present invention is to provide a manufacturing method of a semiconductor integrated circuit which decreases the test cost by reducing the test time.

There is constituted a scan flipflop (scan latch) as a storage circuit, wherein the storage circuit comprises:

a first logic gate for receiving a first signal and a second signal, and for selectively outputting either the first signal or the second signal in accordance with a control signal;

a first storage element for receiving a clock signal, for storing an output signal of the first logic gate in response to the clock signal, and for outputting the stored signal in response to the clock signal; and a second logic gate for receiving an output signal of the first storage element, and for outputting or fixing the output signal of the first storage element in response to the control signal.

There is constituted a semiconductor integrated circuit having a scan path, wherein the semiconductor integrated circuit comprises:

a first storage circuit including first and second input terminals, first and second output terminals, and a first control terminal for receiving a control signal;

a logic circuit for receiving an output signal of the first output terminal of the first storage circuit, for performing a predetermined processing on the output signal, and for outputting a result of the processing; and a second storage circuit including third and fourth input terminals, and a second control terminal for receiving the control signal, wherein when the control signal is in a first state, the first storage circuit stores a first signal, which is input to the first input terminal, to output the stored first signal to the first output terminal;

when the control signal is in a second state, the first storage circuit makes a voltage of the first output terminal to be any voltage of the operation voltages of the logic circuit, and stores a second signal, which is input to the second input terminal, to output the stored second signal to the second output terminal;

when the control signal is in the first state, the second storage circuit stores an output of the logic circuit which is input to the third input terminal; and when the control signal is in the second state, the second storage circuit stores an output of the second output terminal of the first storage circuit which is input to the fourth input terminal.

Furthermore, in the present invention, a scan FF able to fix the output-to-logic signal, a scan FF able to fix the scan-out signal, a scan FF selectable of the output-to-logic signal and scan-out signal, and a normal scan FF are used properly depending on the characteristics (power consumption and delay time) of the logic circuit.

Such a scan FF is registered as one cell in a cell library which describes its function, power consumption and delay information, and is used in the design of a semiconductor integrated circuit.

Furthermore, the design of a semiconductor integrated circuit which uses a plurality of scan FFs properly is achieved as follows. That is, (1) the semiconductor integrated circuit is designed by using the scan FF able to fix the output-to-logic signal, and (2) a scan FF forming a start point of a path which does not satisfy the timing specifications is replaced with the normal scan FF. Also, after the layout, the replacement with the scan FF having a scan-out fixing function is carried out based on the power consumption.

Moreover, a semiconductor integrated circuit apparatus is manufactured as follows. That is, the mask pattern of physical layout of the semiconductor integrated circuit designed as mentioned above is reflected to a semiconductor wafer to form the semiconductor integrated circuit apparatus on the semiconductor wafer. Then, a logic test is conducted on the formed semiconductor integrated circuit apparatus. Here, in the logic test, the frequency at the scan is made equal to the frequency at the logic test. In particular, the clock frequency at the scan is made equal to the clock frequency used at normal operation, so that the rate of the test cost occupying in the manufacturing cost is made small.

DETAILED DESCRIPTION OF THE EMBODIMENTS

Hereinafter, embodiments of the present invention will be described with reference to the drawings.

Figure 1:
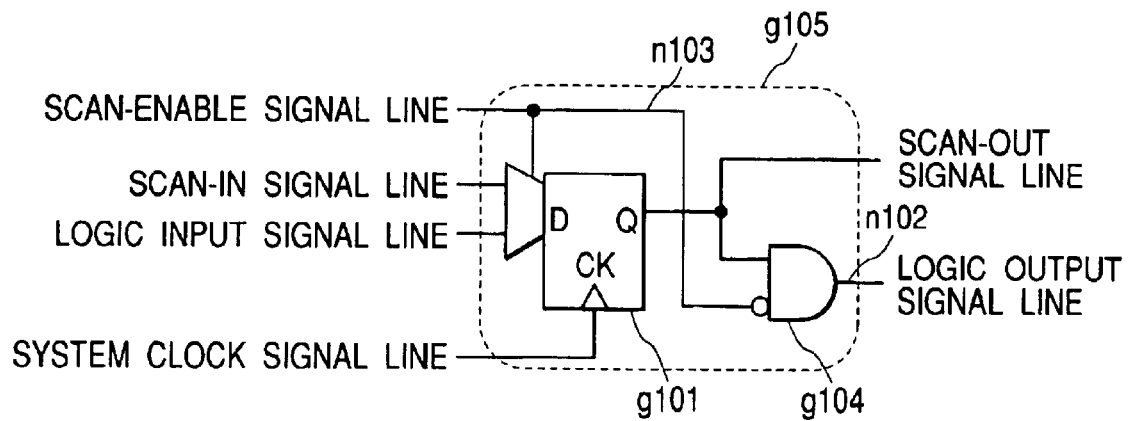
FIG. 1 is a circuit configuration diagram showing a semiconductor integrated circuit according to the first embodiment of the present invention.

FIG. 1 is a circuit configuration diagram showing a semiconductor integrated circuit according to the first embodiment of the present invention. This is an example in which the present invention is applied to the conventional MUX-type scan FF. In this configuration, a 2-input AND gate g104 is inserted between an output terminal Q of a MUX-type scan FF g101 and a logic output signal line n102. The 2-input AND gate g104 is controlled by a scan-enable signal line n103 and performs the role of fixing the transition of an output signal of the MUX-type scan FF g101. Hereinafter, a scan FF g105 according to the present embodiment is referred to as a "scan FF able to fix the output-to-logic signal".

Figure 2:
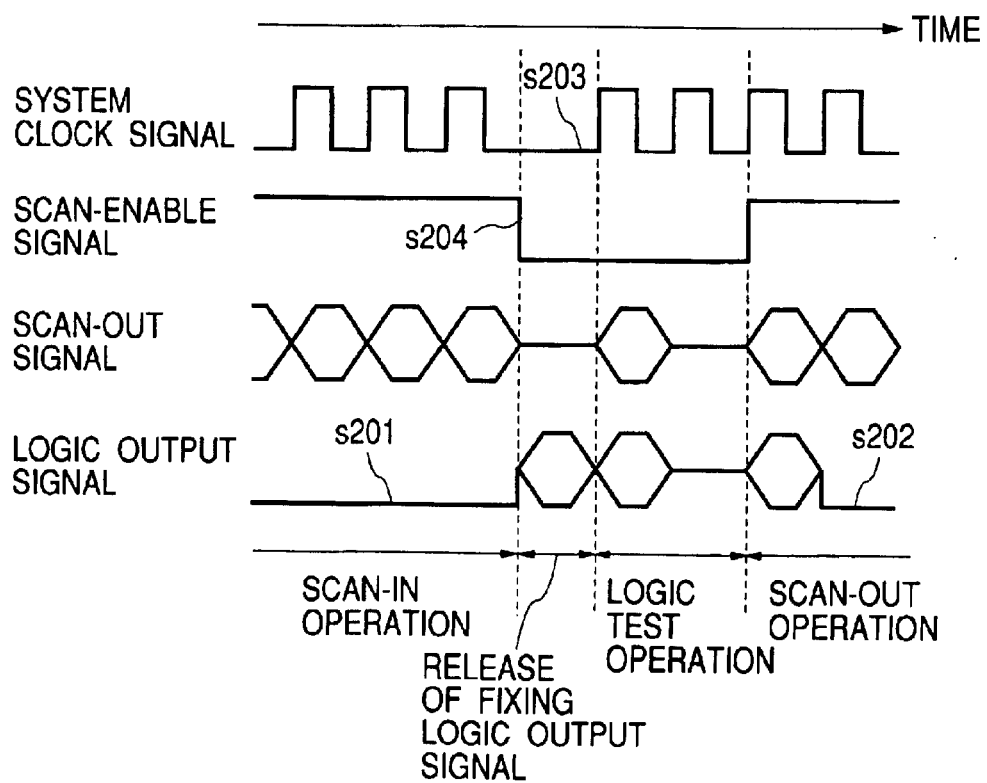
FIG. 2 is a timing chart showing the operation of the first embodiment.
Figure 24:
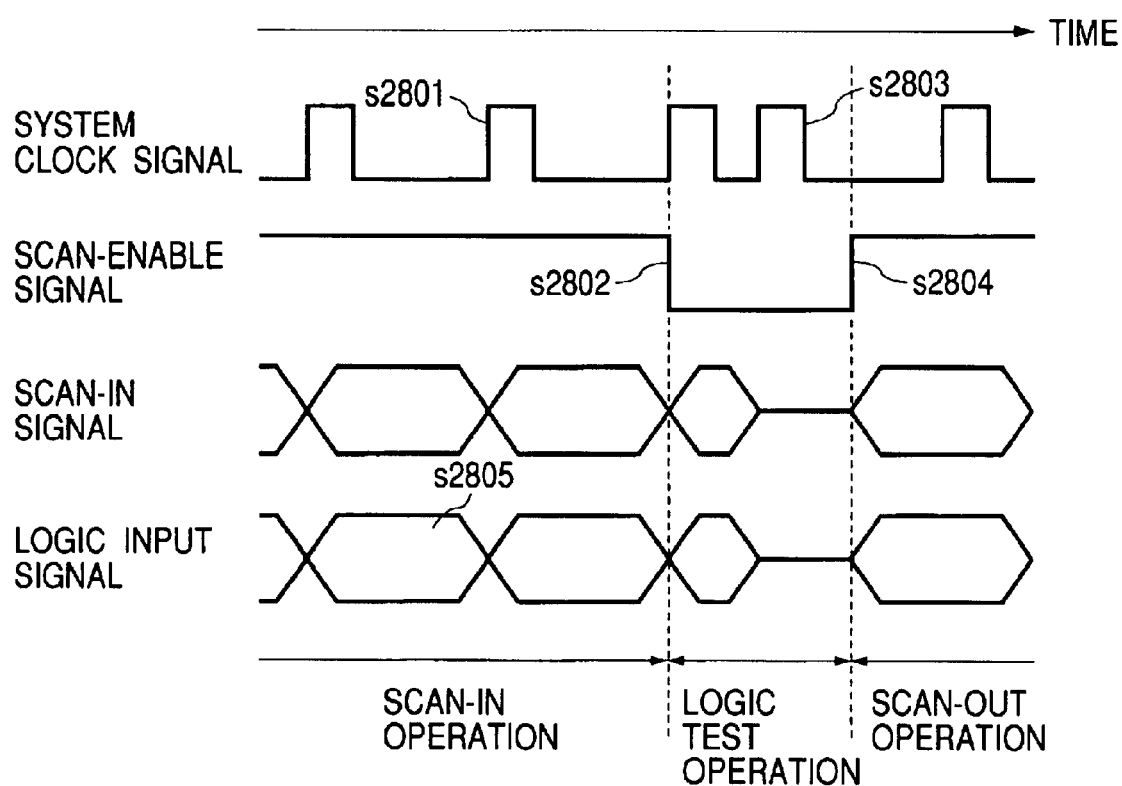
FIG. 24 is a timing chart showing an operation of a scan flipflop used in the conventional technique.

FIG. 2 is a timing chart showing the operation of the first embodiment. First, at scan-mode operation, since the scan-enable signal is "High", the logic output signal line n102 is fixed to "Low" by the 2-input AND gate g104 (s201 and s202). In this manner, according to the present configuration, it is possible to fix the transition of the logic output signal at scan-mode operation (s2805 in FIG. 24) which occurs in the normal scan FF, so that it is possible to reduce the power consumption at scan-mode operation.

Next, prior to the logic test operation, the release of fixing the output signal of logic circuit is performed. During this time, the transition of the clock signal is stopped (s203), and the "Low" fixing of the logic output signal line n102 is released by setting the scan-enable signal from "High" to "Low" (s204). Here, a waiting time corresponding to the signal propagation delay of one gate (i.e., AND gate g104) is provided, so that the logic test operation is prevented from being performed with the unstable signals. However, the increase of the whole test time due to this waiting time is very small. Generally, the number of the clock signal transitions required for the scan-mode operation is several hundred to several thousand times as compared with that in the logic test operation, because the time required for the scan-mode operation occupies the most part of the test time. According to the configuration shown in FIG. 2, it is possible to perform the scan-mode operation using the same frequency as that of the logic test operation, so that it is possible to reduce the time required for the scan-mode operation.

The clock signal and the scan-enable signal may be supplied from the outside of the chip by using a tester, or may be produced within the chip by using an oscillation circuit added with a counter. Accordingly, by using the present configuration, it is possible to improve the frequency of the scan-mode operation without causing the fault detection mistake due to the excessive voltage drop or the chip destruction due to the heat generation, so that the test time can be reduced. In the first embodiment, since it is only required to add one logic gate for fixing the output signal to logic circuit g104 to each of the scan FFs, the increase of the chip area can be suppressed to a small amount. According to the inventors' study, it has been found that the increase of the chip area can be reduced to about 1%.

Figure 3:
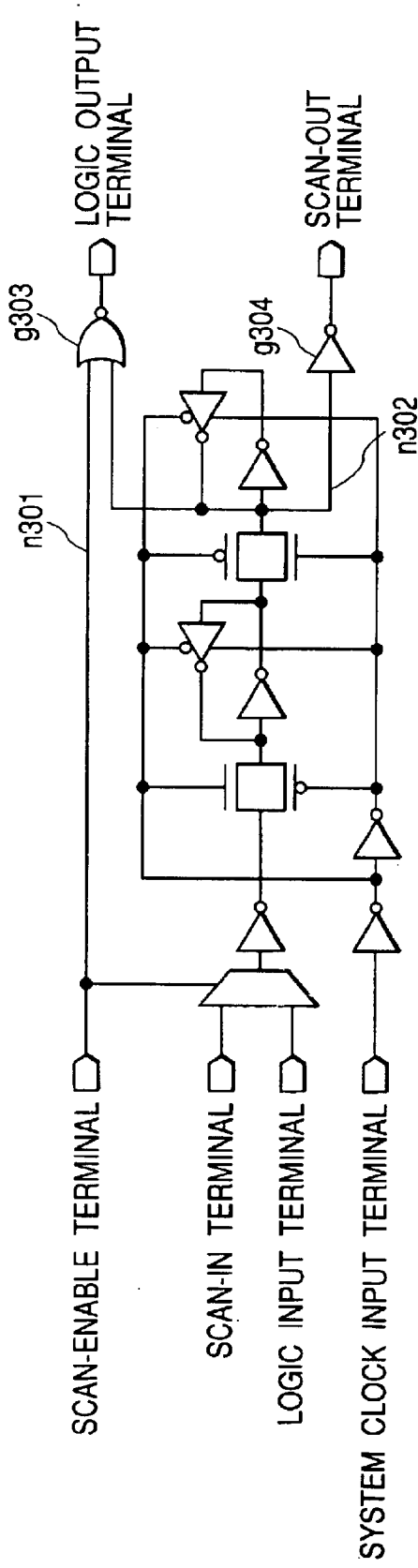
FIG. 3 is a circuit configuration diagram showing a semiconductor integrated circuit according to the second embodiment of the present invention.

FIG. 3 is a circuit configuration diagram showing a semiconductor integrated circuit according to the second embodiment of the present invention. This is an example in which the function of the logic gate for fixing the output signal to logic circuit g104 described in the first embodiment is incorporated into the inside of the MUX-type scan FF. In this configuration, the output terminal is divided into a scan-out terminal and a logic output terminal. Further, before the logic output terminal, a 2-input NOR gate g303 which is controlled by a scan-enable signal line n301 and a signal line n302 with inverse polarity to the logic output is inserted. By forming in such a configuration, as compared with the first embodiment, the number of the gate stages present on the path from a system clock terminal to a logic output terminal can be reduced. In other words, the number of the gate stages on the path from the signal line to the logic output terminal is two stages in the first embodiment (the NOR gate g304 (in the conventional MUX-type scan FF, the scan-out terminal shown in FIG. 3 is the only output terminal) and the AND gate g104), but there is only one stage (the NOR gate g303) in the present embodiment. Accordingly, by applying the present invention, the delay of the user logic circuit can be made smaller. Furthermore, since it is possible to reduce the size of the transistor forming the scan FF as compared with the first embodiment, the chip area reduction effect and the power consumption reduction effect can be expected.

It should be noted that the configuration of the present invention is not limited to the configuration mentioned above. For example, in FIG. 1, it is possible to use a transfer gate in place of the 2-input AND gate g104. In this case, there is an advantage that the chip area can be made smaller.

Figure 4:
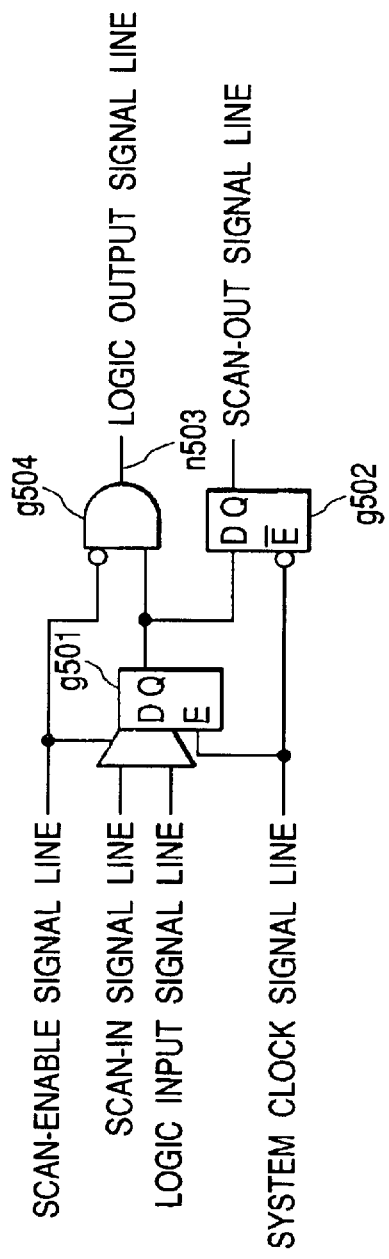
FIG. 4 is a circuit configuration diagram showing a semiconductor integrated circuit according to the third embodiment of the present invention.

FIG. 4 is a circuit configuration diagram showing a semiconductor integrated circuit according to the third embodiment of the present invention. This is an example, in which the present invention is applied to a MUX-type scan latch. The scan latch is configured in which an output terminal Q of a master latch g501 is connected to an input terminal D of a slave latch g502 dedicated for scan. The present invention can be applied also to the scan latch instead of the scan FF in a similar way as in the first embodiment. In other words, an AND gate for fixing the output signal to logic circuit g504 may be inserted between the output terminal Q of the storage element (the latch in this embodiment) and a logic output signal line n503.

Figure 5:
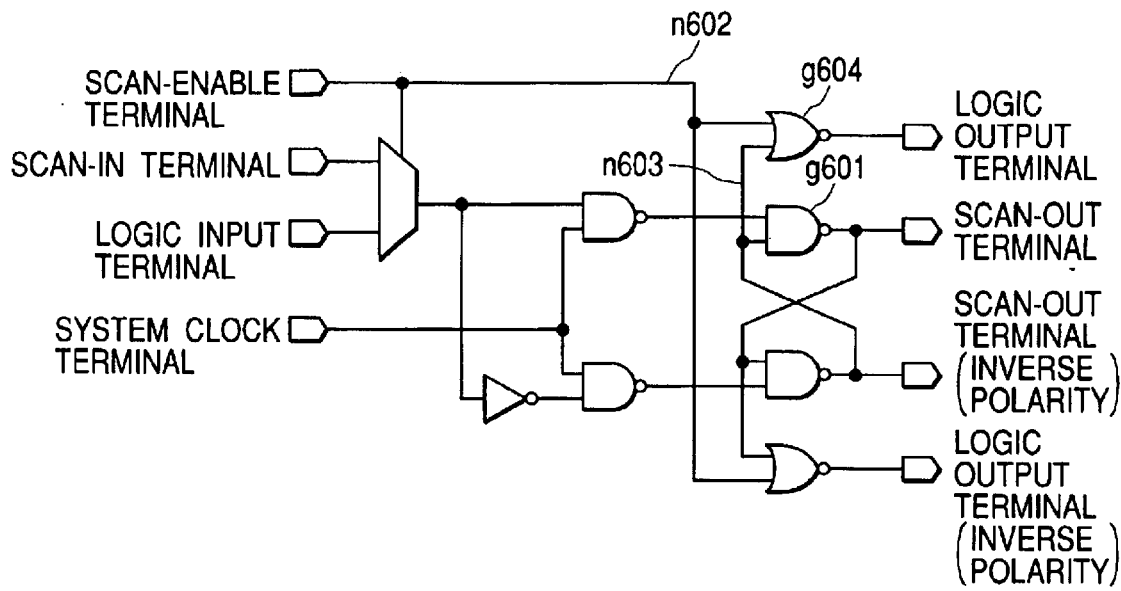
FIG. 5 is a circuit configuration diagram showing a semiconductor integrated circuit according to the fourth embodiment of the present invention.

FIG. 5 is a circuit configuration diagram showing a semiconductor integrated circuit according to the fourth embodiment of the present invention. This is an example, in which the gate able to fix the output signal to logic circuit g504 described in the fourth embodiment is incorporated into the inside of the master latch g501 of the MUX-type scan latch. However, in this example, it is configured so that a signal with inverse polarity can be output. Even in the case where the output terminal of the master latch is driven not by the inverter gate but by a NAND gate g601, the present invention can be applied in the same way as the second embodiment. Specifically, before the logic output terminal, a 2-input NOR gate g604 controlled by a scan-enable signal line n602 and a signal line n603 with inverse polarity to the logic output may be inserted.

Figure 6:
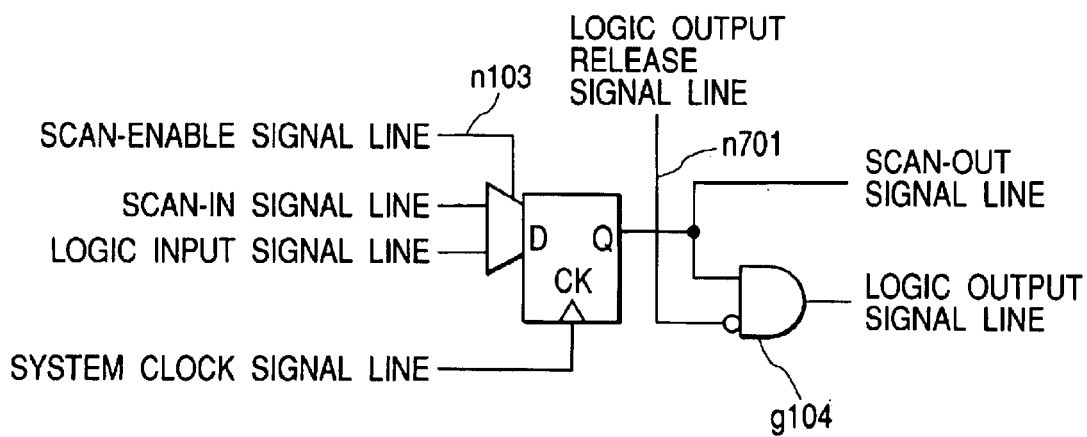
FIG. 6 is a circuit configuration diagram showing a semiconductor integrated circuit according to the fifth embodiment of the present invention.

FIG. 6 is a circuit configuration diagram showing a semiconductor integrated circuit according to the fifth embodiment of the present invention. This is an example, in which in order to control the logic gate for fixing the output signal to logic circuit g104 described in the first embodiment, a logic output release line n701 is provided instead of the scan-enable signal line n103.

Figure 7:
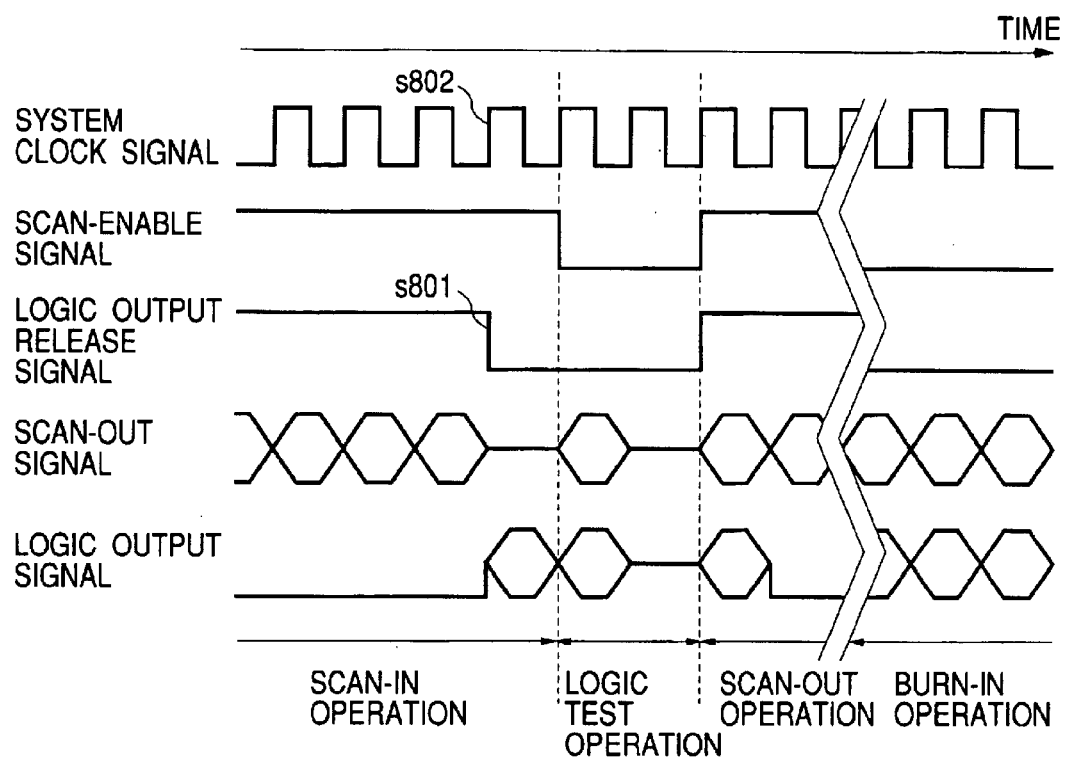
FIG. 7 is a timing chart showing the operation of the fifth embodiment.

FIG. 7 is a timing chart showing the operation of the fifth embodiment. At the time of the transition from the scan-in operation to the logic test operation, it is possible to perform the release to fix the output signal to logic circuit, which is needed in the first embodiment, in parallel with the scan-in operation by setting the signal for fixing the output signal to logic circuit to "LOW" (s801) earlier than the scan-enable signal. For this reason, it becomes unnecessary to stop the clock signal transition (s802). Accordingly, there is an advantage that the test time can be reduced as compared with the first embodiment. Also, in the case of performing the burn-in test, the user logic circuit is operated with higher operating probability than that at normal operation. According to the present configuration, at burn-in, it becomes possible to operate the user logic circuit while inputting the signal to the scan FF.

Figure 8:
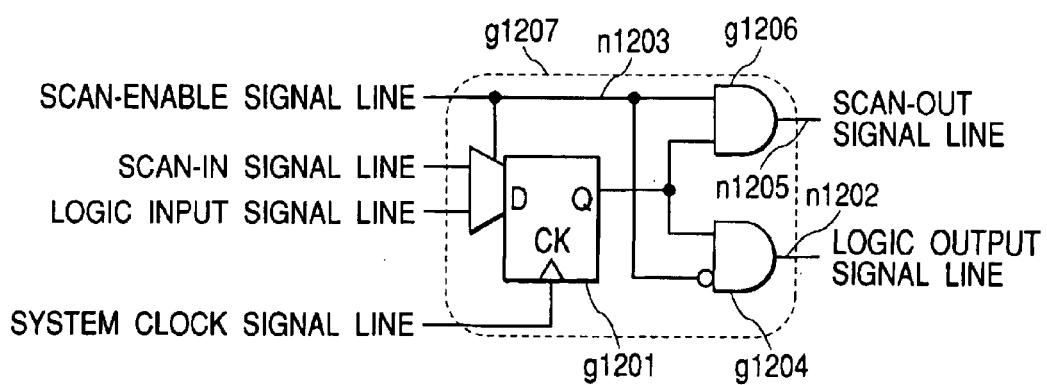
FIG. 8 is a circuit configuration diagram showing a semiconductor integrated circuit according to the sixth embodiment of the present invention.

FIG. 8 is a circuit configuration diagram showing a semiconductor integrated circuit according to the sixth embodiment of the present invention. In this embodiment, a 2-input AND gate for fixing the scan-out signal g1206 which is controlled by a scan-enable signal line n1203 is inserted between an output terminal Q of a MUX-type scan FF g1201 and a scan-out signal line n1205 in the scan FF with logic gate for fixing the output signal to logic circuit g1204 described in the first embodiment. When configured in this manner, the transition of the logic output signal at scan-mode operation can be fixed, and the transition of the scan-out signal is fixed at normal operation because the scan-out signal is fixed to "Low" when the scan-enable signal is set to "Low" by the gate g1206. Thereby, the scan path is not driven, so that the power consumption at normal operation can be reduced. Furthermore, the scan-in signal and the scan-out signal (referred to as a "scan signal" altogether) are fixed to "Low" at normal operation, so that the cross-talk noise reducing effect between the user logic circuit signal lines sandwiching the scan signal line can be expected. Hereinafter, the scan FF g1207 in the present embodiment is referred to as a "scan FF selectable of the output-to-logic signal and scan-out signal". Also, a configuration of the scan FF may be considered in which the gate g1204 is omitted from the configuration shown in FIG. 8. Such a scan FF is referred to as a "scan FF able to fix the scan-out signal".

Figure 9:
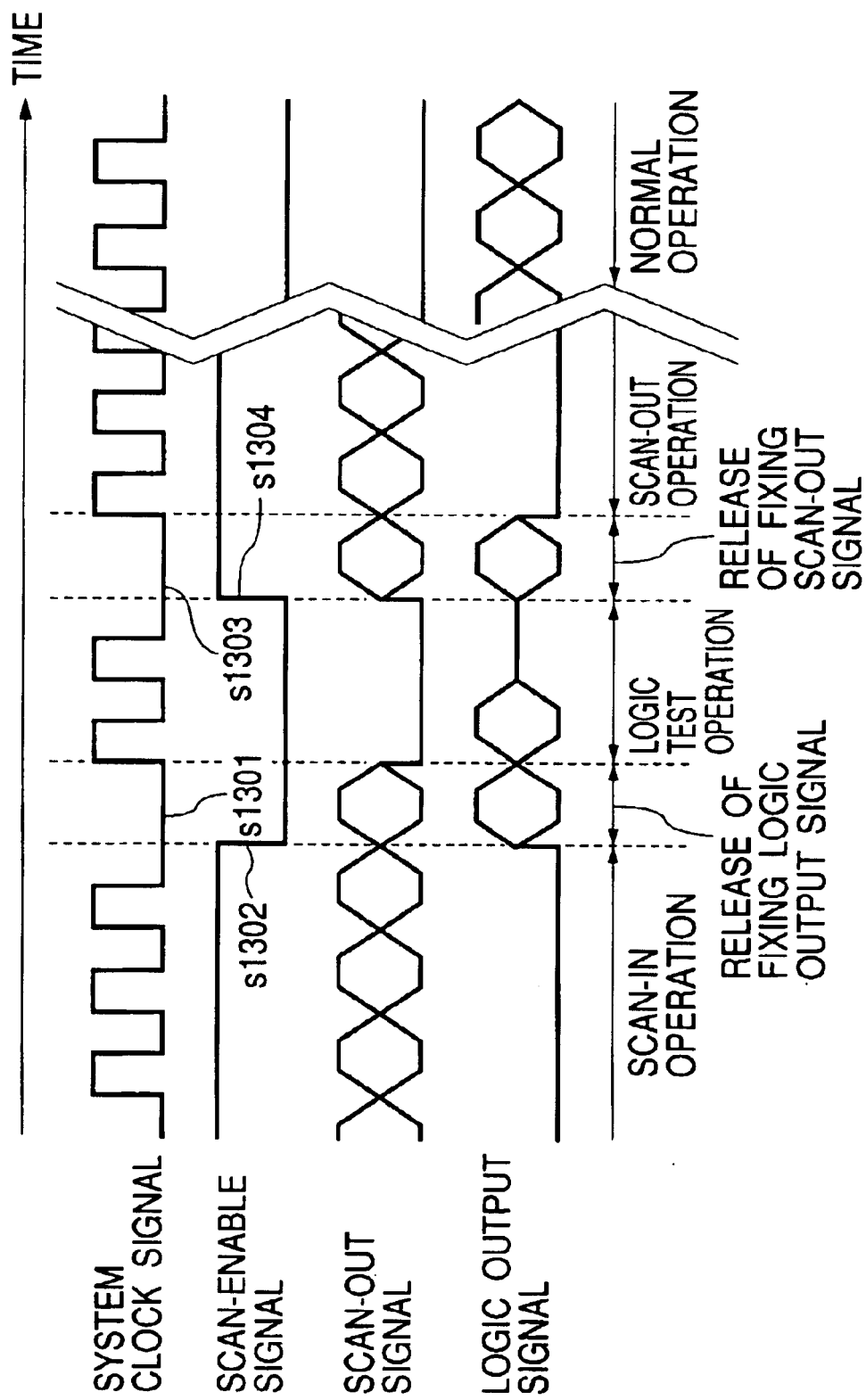
FIG. 9 is a timing chart showing the operation of the sixth embodiment.

FIG. 9 is a timing chart showing the operation of the sixth embodiment. Prior to the logic test operation, the release of fixing logic output signal is carried out. During this time, the transition of the clock signal is stopped (s1301), and the fixing to "Low" of the logic output signal is released by setting the scan-enable signal from "High" to "Low" (s1302). Also, after the logic test operation is completed, the release of fixing scan-out signal is carried out. During this time, the transition of the clock signal is stopped (s1303), and the fixing to "Low" of the scan signal is released by setting the scan-enable signal from "Low" to "High" (s1304). Until this release of fixing logic output signal and the release of fixing scan-out signal are completed, a waiting time is required. However, the increase of the whole test time due to this waiting time is very small for the similar reason as that described in the first embodiment.

Figure 10:
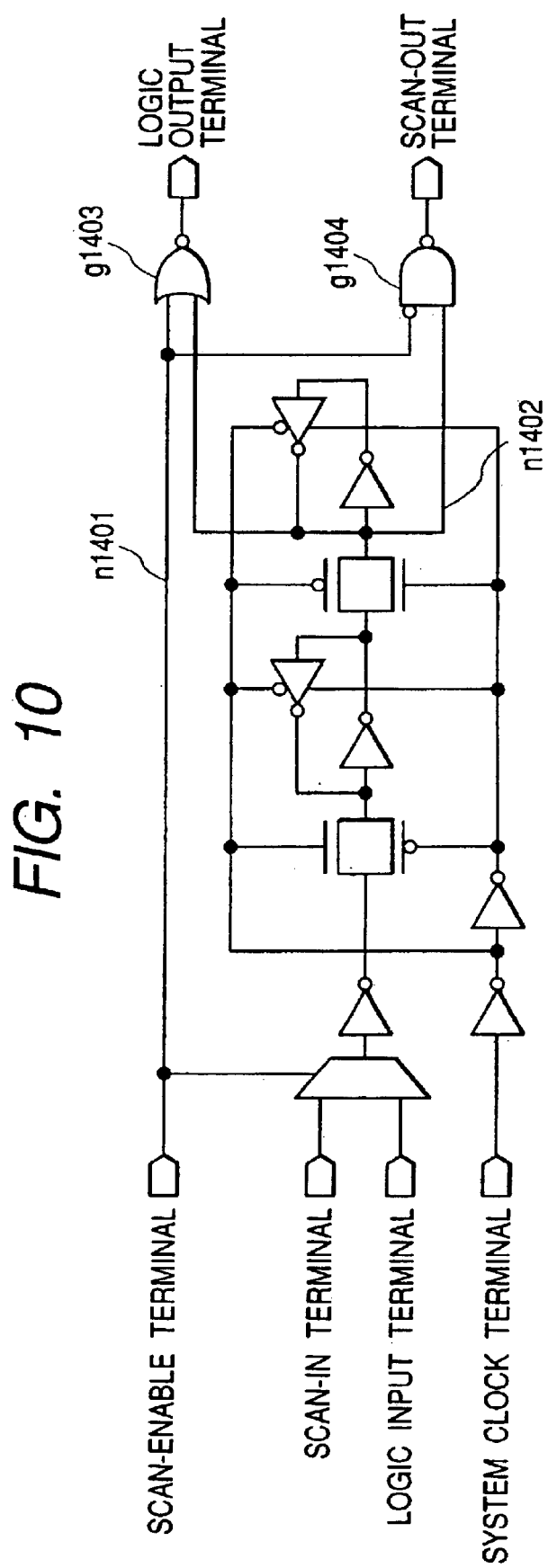
FIG. 10 is a circuit configuration diagram showing a semiconductor integrated circuit according to the seventh embodiment of the present invention.

FIG. 10 is a circuit configuration diagram showing a semiconductor integrated circuit according to the seventh embodiment of the present invention. This is an example in which both the logic gate for fixing the output signal to logic circuit g1204 and the scan FF able to fix the scan-out signal g1206 are incorporated into the inside of the MUX-type scan FF. In this configuration, a 2-input NOR gate g1403 controlled by a scan-enable signal line n1401 and a signal line n1402 with inverse polarity to the output is inserted before the logic output terminal. Furthermore, a 2-input NOR gate g1404 controlled by a scan-enable signal line n1401 and a signal line n1402 with inverse polarity to the output is inserted before the scan-out terminal. In such a configuration, the number of the gate stages on the path from the system clock terminal to the logic output terminal can be reduced, and the number of the gate stages on the path from the system clock terminal to the scan-out terminal can be reduced, for the reason similar to that described the second embodiment. In addition, the chip area reducing effect and the power consumption reducing effect can be expected.

Figure 11:
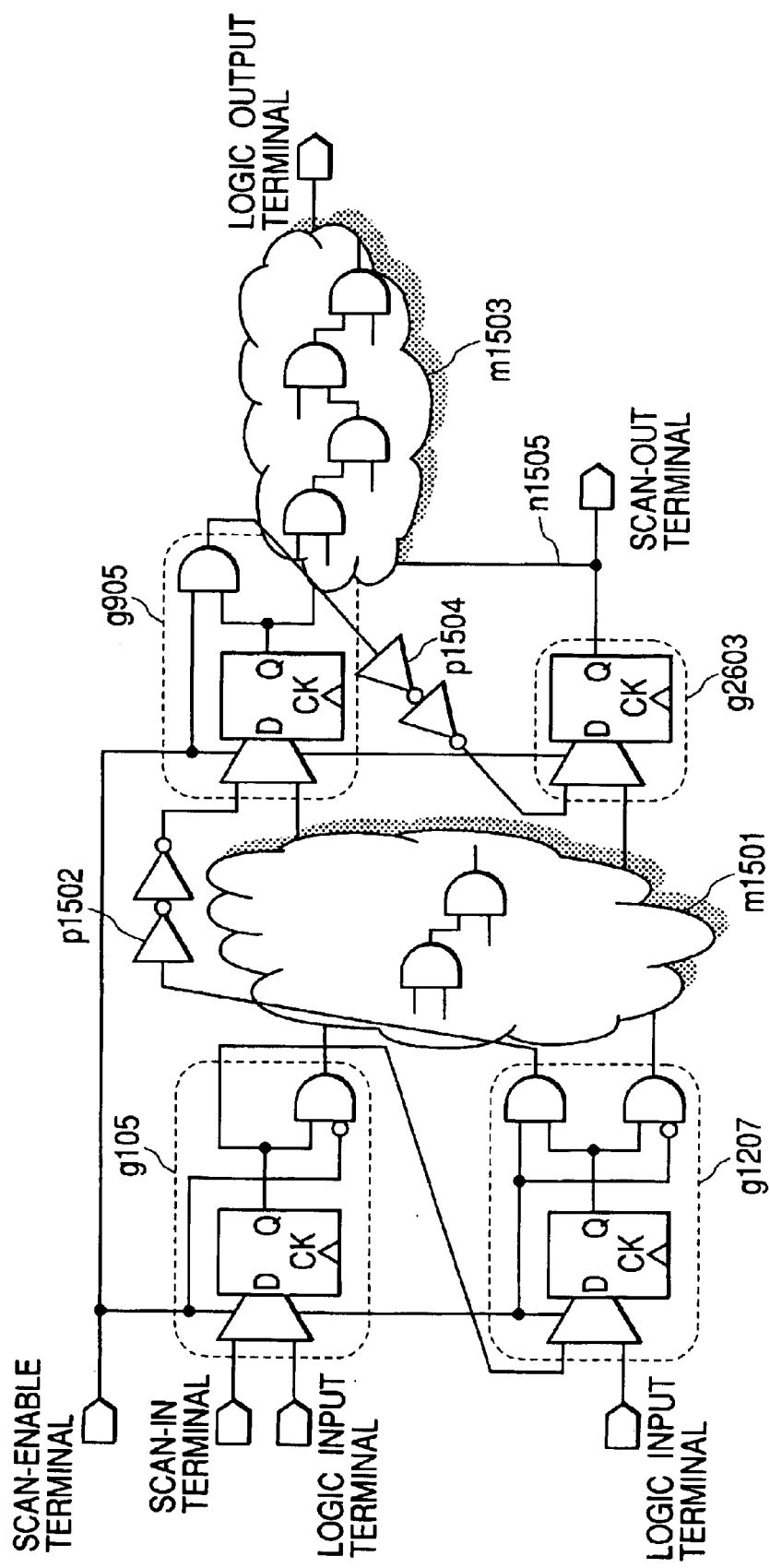
FIG. 11 is a circuit configuration diagram showing a semiconductor integrated circuit according to the eighth embodiment of the present invention.

FIG. 11 is a circuit configuration diagram showing a semiconductor integrated circuit according to the eighth embodiment of the present invention. This is an example in which the scan FF able to fix the output-to-logic signal, the scan FF able to fix the scan-out signal, and the scan FF selectable of the output-to-logic signal and scan-out signal are mixed with the normal scan FF within the semiconductor integrated circuit. In this configuration, the scan FF able to fix the output-to-logic signal g105 is connected to a user logic circuit m1501 having small delay and having large power consumption. The power consumption at test time is decreased by the application of the scan FF able to fix the output-to-logic signal g105. Because the effect of delay due to the addition of the gate does not pose any problem in this case. In addition, the scan FF selectable of the output-to-logic signal and scan-out signal g1207 is connected to a scan path p1502 having large power consumption. There is an effect that the power consumption due to the unnecessary driving of the scan path at normal operation is reduced by the application of the scan FF selectable of the output-to-logic signal and the scan-out signal g1207. On the other hand, the normal scan FF is connected to a user logic circuit m1503 having large delay and small power consumption. In the case where the delay time is a problem, the conventional type scan FF is desirable. In addition, a scan FF able to fix the scan-out signal g905 is connected to a scan path p1504 having large power consumption. The power consumption due to the unnecessary driving of the scan path at normal operation is reduced by the application of the scan FF able to fix the scan-out signal g905. Further, the delay of the user logic circuit is equivalent to that of the conventional type scan FF. In this configuration, it is possible to achieve the reduction of the power consumption at test operation and at normal operation, while suppressing the increase in delay (hereinafter, referred to as "path delay") from the start point to the end point of the path in the user logic circuit.

Figure 12:
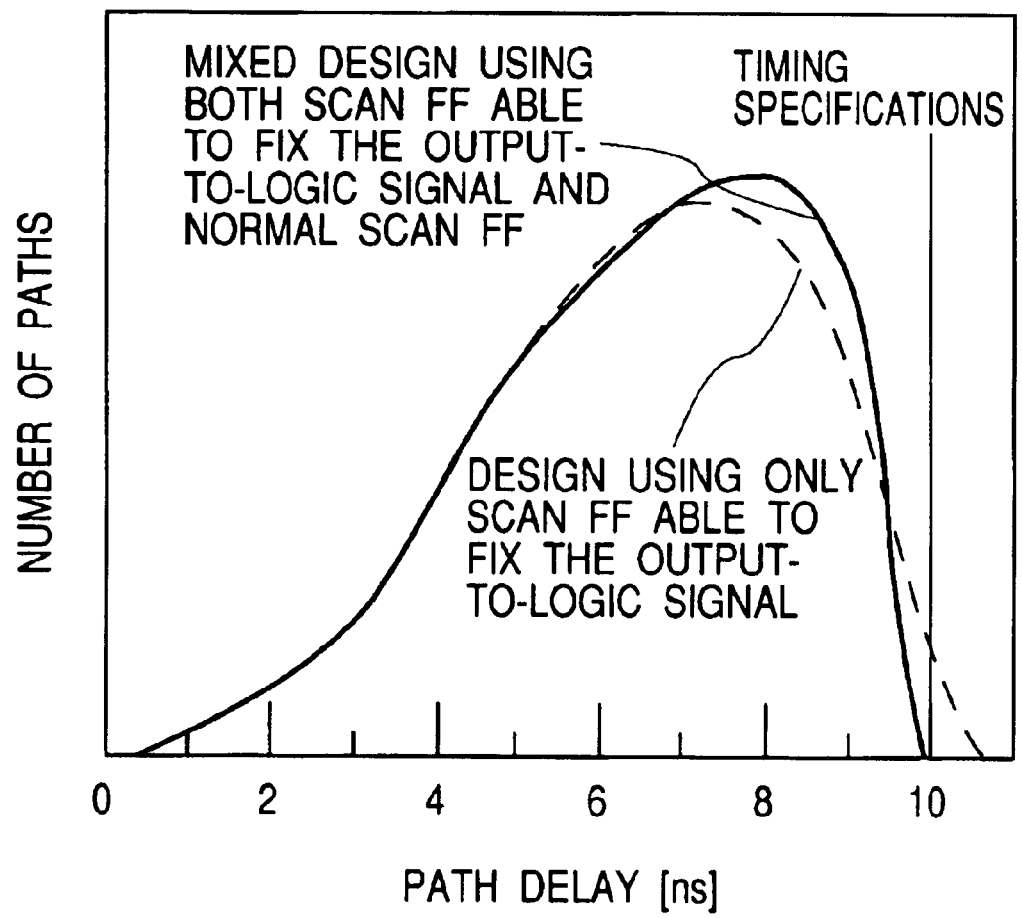
FIG. 12 is a figure of histogram of a path delay in the eighth embodiment.

FIG. 12 is a figure of histogram of the path delay according to the eighth embodiment. For example, it is supposed that a path which violates the delay value from design specifications is caused partially due to applying the scan FF able to fix the output-to-logic signal to all the scan FFs within the user logic circuit. It is possible to improve so that the delay value from design specifications is met, by replacing the scan FF able to fix the output-to-logic signal on the path which violates the delay value from design specifications with the normal scan FF. However, in the case where the scan FF able to fix the output-to-logic signal is mixed with the normal scan FF, the power consumption will be increased as compared with the case where only the scan FF able to fix the output-to-logic signal is used. But, the use rate of the normal scan FF usually decreases, so that the increase of the power consumption can be suppressed to small amount. In the present embodiment, it is possible to reduce the power consumption at test operation to a half or low as compared with the prior art.

Figure 13:
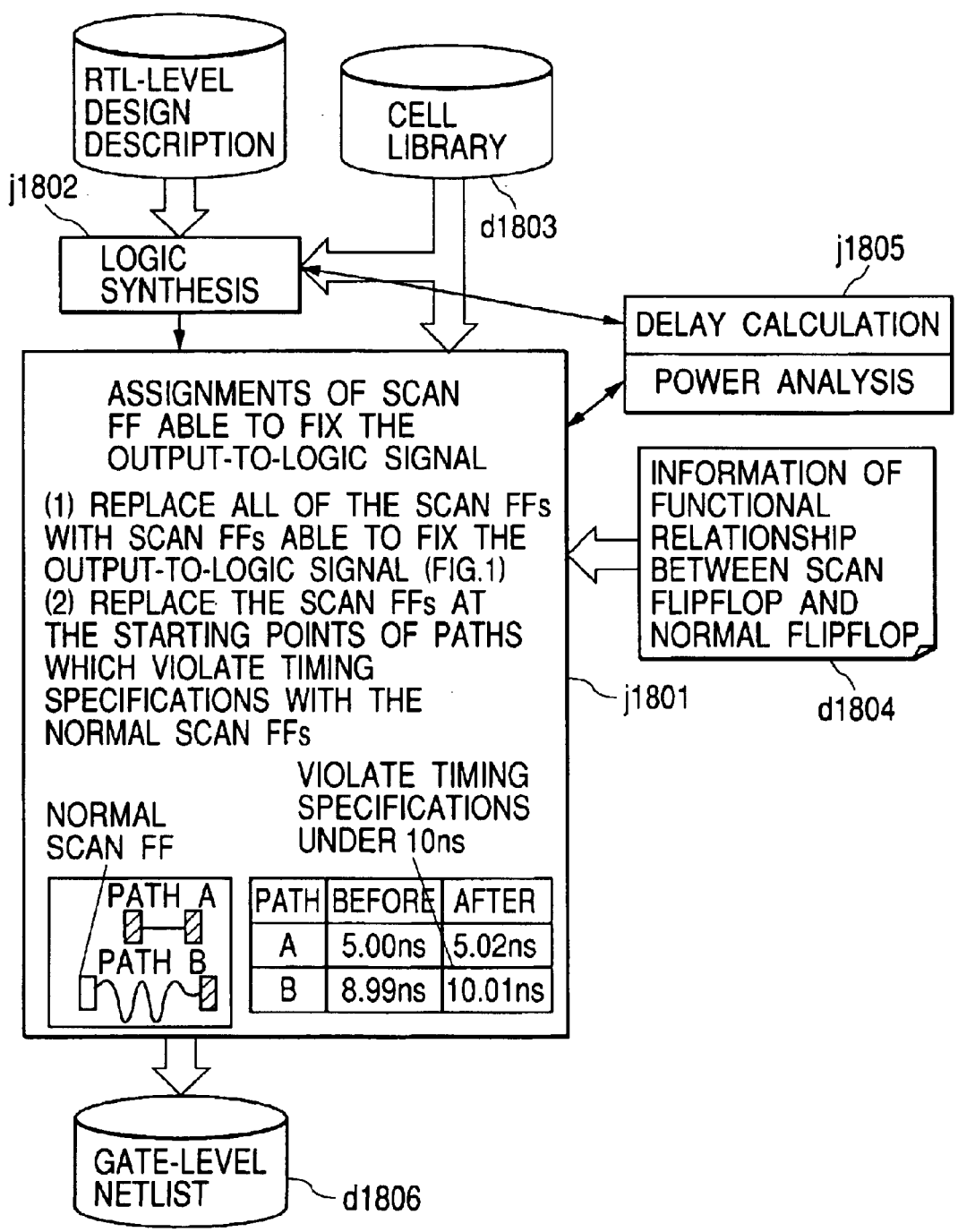
FIG. 13 is a diagram showing a design flow in the eighth embodiment.

FIG. 13 is a diagram showing a design flow relating to the eighth embodiment. This is an example of a design flow for the purpose of applying the scan FF able to fix the output-to-logic signal according to the present invention. The assignments of scan FF able to fix the output-to-logic signal j1801 is performed after logic synthesis j1802. A cell library d1803 and information of functional relationship between scan flipflop and normal flipflop d1804 are input. While repeating the delay calculation and power analysis j1805, a gate-level netlist d1806 is ultimately output. As to the logic synthesis j1802 and the delay calculation and power analysis j1805, the conventional technique may be used. As to the detailed content of the cell library d1803 and the information of functional relationship between scan flipflop and normal flipflop d1804, it will be explained later. In the processing of the assignments of scan FF able to fix the output-to-logic signal j1801, (1) first, all of the scan FFs within the logic circuit are set with the scan FFs able to fix the output-to-logic signal, and then (2) the scan FFs at the starting points of paths which violate the timing specifications (the delay value from design specifications) are replaced with the normal scan FFs. For example, as to the paths A and B, it is supposed that the delays after the processing of (1) became 5.02 ns and 10.01 ns, respectively. With respect to the delay value from design specifications of 10 ns, the path B violates the specifications. Thus, the scan FF able to fix the output-to-logic signal at the starting point of the path B is replaced with the normal scan FF.

Figure 14:
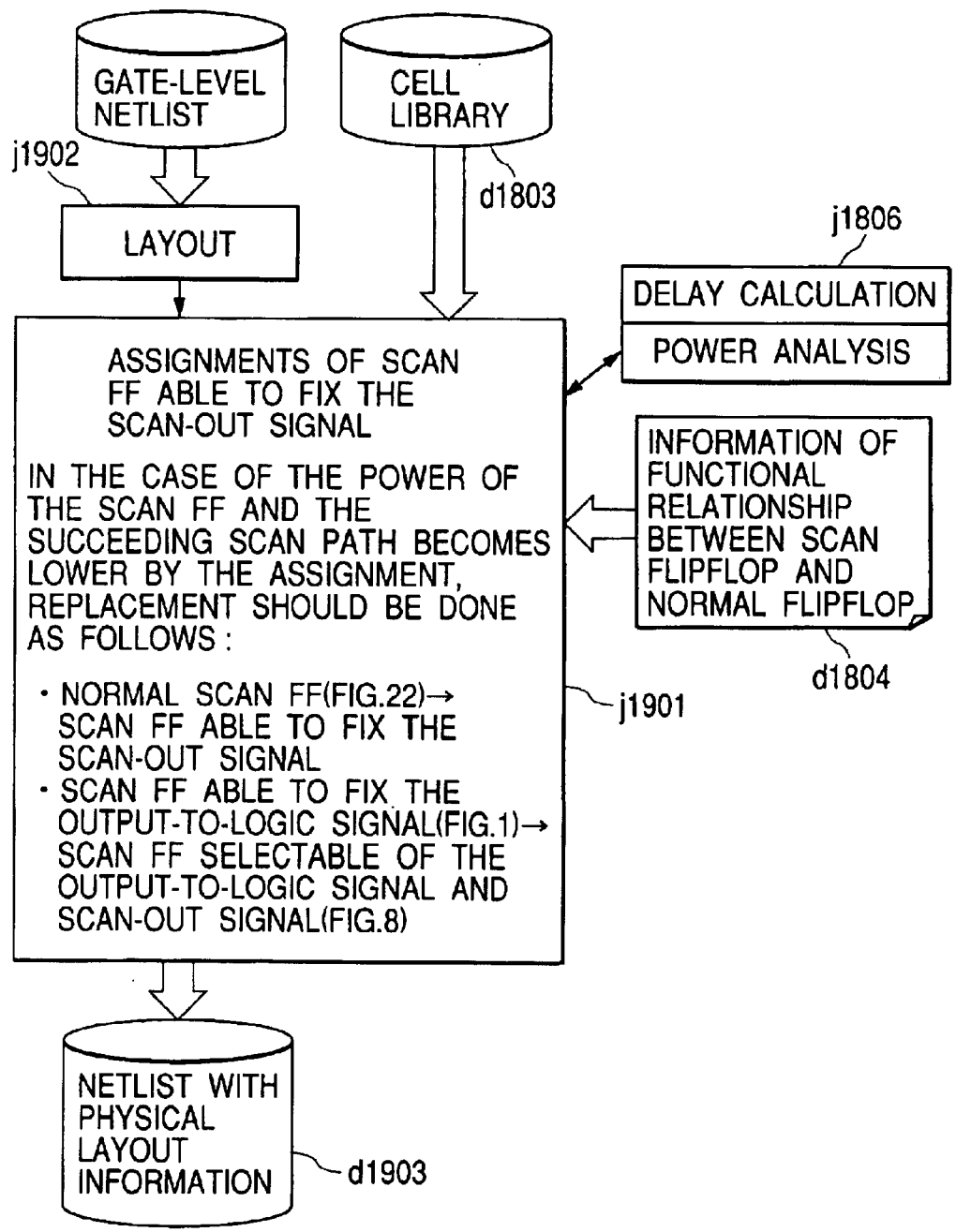
FIG. 14 is a diagram showing a design flow in the eighth embodiment

FIG. 14 is a diagram showing a design flow relating to the eighth embodiment. This is an example of a design flow for applying the scan FF able to fix the scan-out signal, and the scan FF selectable of the output-to-logic signal and scan-out signal. Since the delay time of the user logic circuit including the delay due to wiring is calculable after the layout, the assignments of scan FF able to fix the scan-out signal j1901 is carried out after the layout j1902. The cell library d1803 and the information of functional relationship between scan flipflop and normal flipflop d1804 are input, and while repeating the delay calculation and power analysis j1805, the netlist with physical layout information d1903 is ultimately output. As to the layout j1902, the conventional technique may be used. In the processing of the assignments of scan FF able to fix the scan-out signal j1901, the normal scan FF is replaced with the scan FF able to fix the scan-out signal, and the scan FF able to fix the scan-out signal is replaced with the scan FF selectable of the output-to-logic signal and scan-out signal, in the case where the total power consumption of the scan FF and the scan path decreases.

It will be explained on the configurations disclosed in FIGS. 13 and 14, hereinafter. The cell library d1803 contains cell data including the normal scan FF, scan FF able to fix the output-to-logic signal, and scan FF selectable of the output-to-logic signal and scan-out signal. The attributes of the stored cell include the power consumption of cell, the input terminal name, the output terminal name, the logic function, and the delay.

Figure 15:
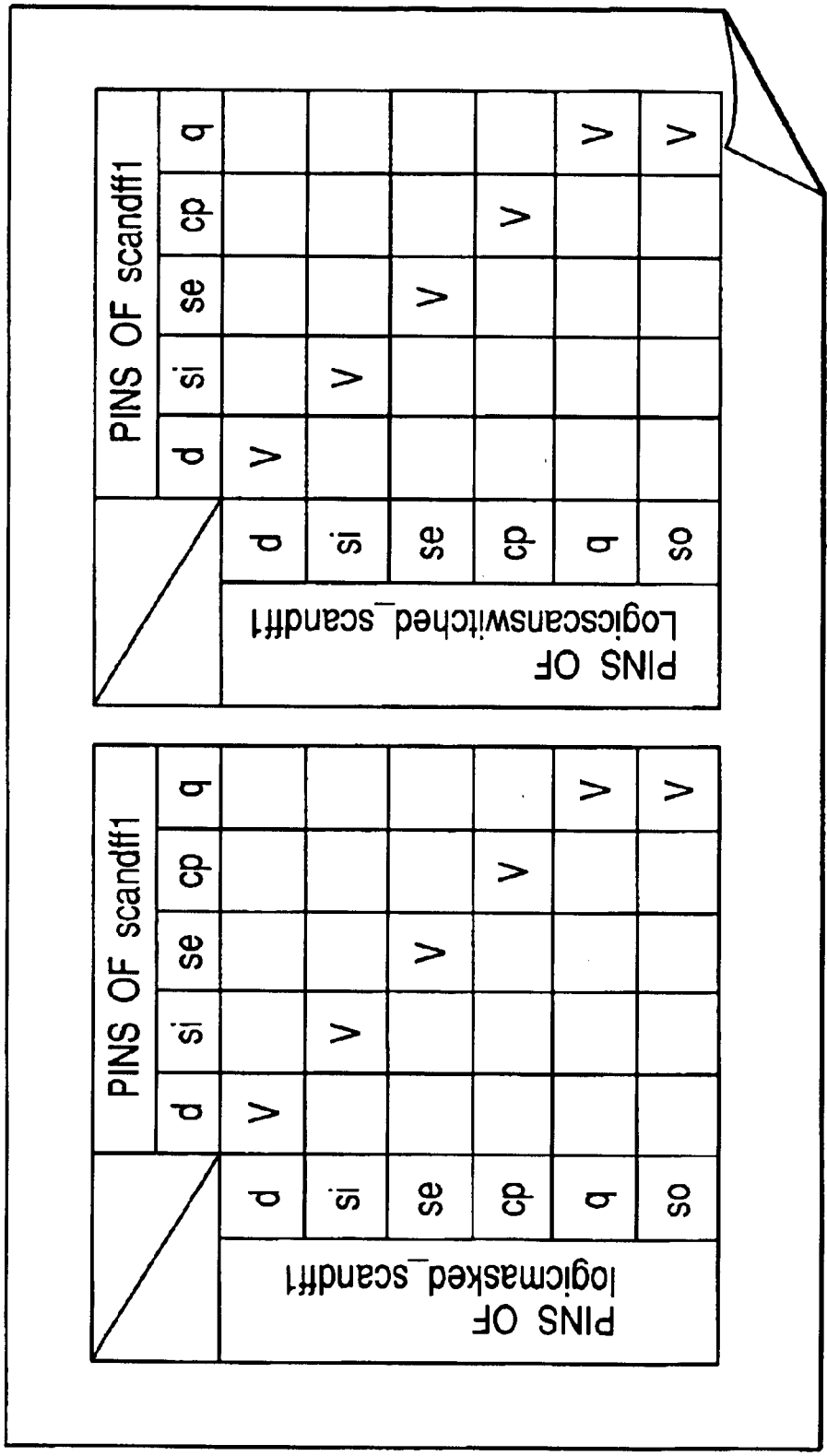
FIG. 15 is a diagram showing information of functional relationship between scan flipflop and normal (non-scan) flipflop.

FIG. 15 is a diagram showing the information of functional relationship between scan flipflop and normal flipflop d1804. This is an example which indicates the correspondence between the output terminal of the normal scan FF (scandff1) and the output terminal of the scan FF able to fix the output-to-logic signal (logicmasked-scandff1), and between the output terminal of the normal scan FF (scandff1) and the output terminal of the scan FF selectable of the output-to-logic signal and scan-out signal (logicscanswitched-scandff1). Here, for the cell name and the terminal name of each of the scan FFs, the names defined in the cell library d1803 are used. Thereby, the replacement between the normal scan FF, and the scan FF able to fix the output-to-logic signal, the scan FF selectable of the output-to-logic signal and scan-out signal can be performed.

Figure 16:
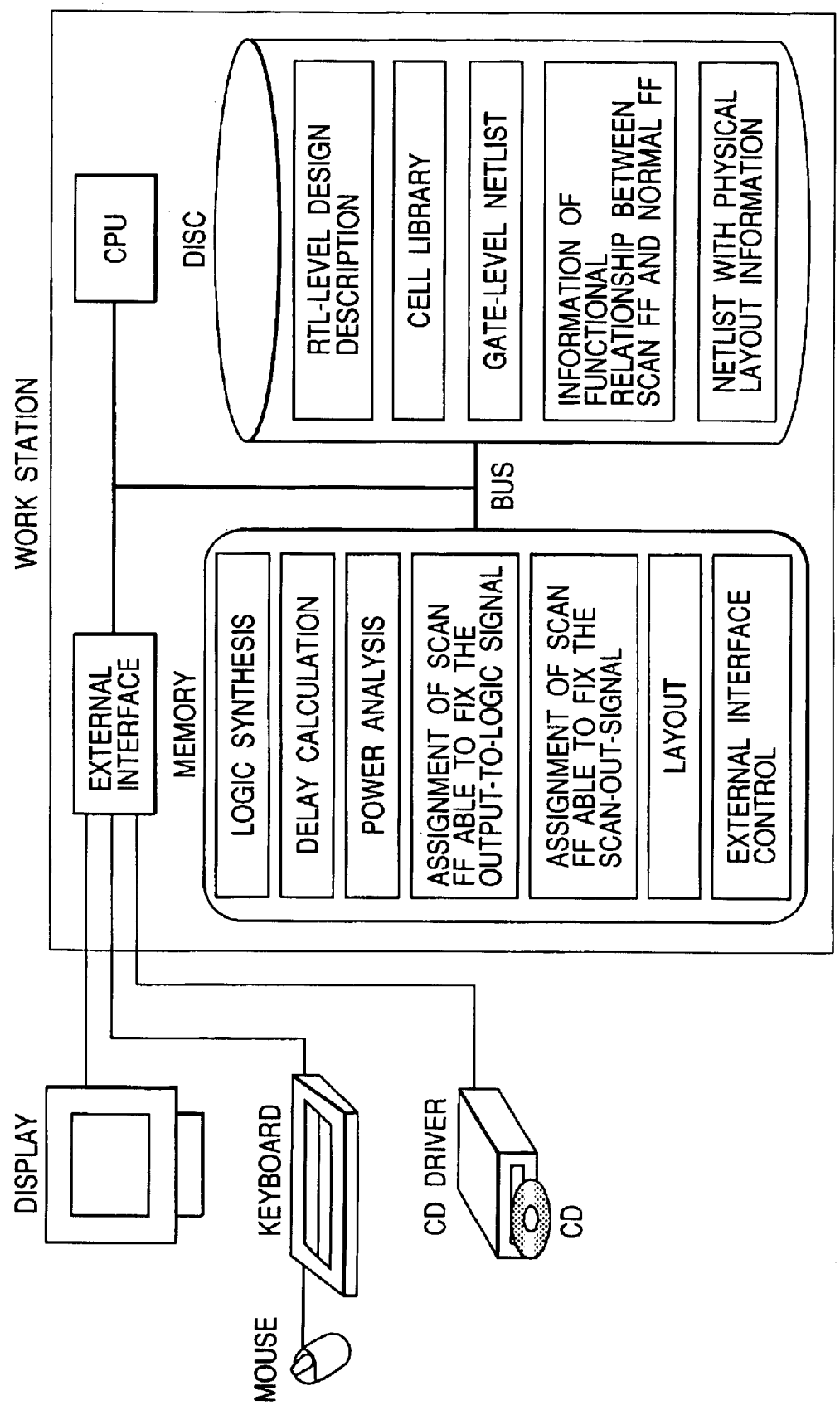
FIG. 16 is a configuration diagram showing a design apparatus according to the present invention, and a storage medium.

FIG. 16 is a configuration diagram showing a design apparatus for designing a semiconductor integrated circuit apparatus to which the present invention is applied, and showing a storage medium. In the configuration of the design apparatus (work station) for applying the scan FF according to the present invention, the programs for implementing the logic synthesis, the delay calculation, the power analysis, the layout, the assignment of scan FF able to fix the output-to-logic signal described in FIG. 13, the assignment of scan FF able to fix the scan-out signal described in FIG. 14, and the external interface control are stored in a memory. Also, data expressing the RTL-level design description, the cell library, the gate-level netlist, the information of functional relationship between scan FF and normal FF described in FIGS. 13 and 14, and the netlist with physical layout information are stored in the disc. Each of the programs can be manipulated and implemented by input from a keyboard or a mouse. Also, it is possible to refer to the implementation results of the respective programs by outputting them to a display. Also, all the stored programs and data can be preserved by a storage medium such as a compact disc.

Figure 17:
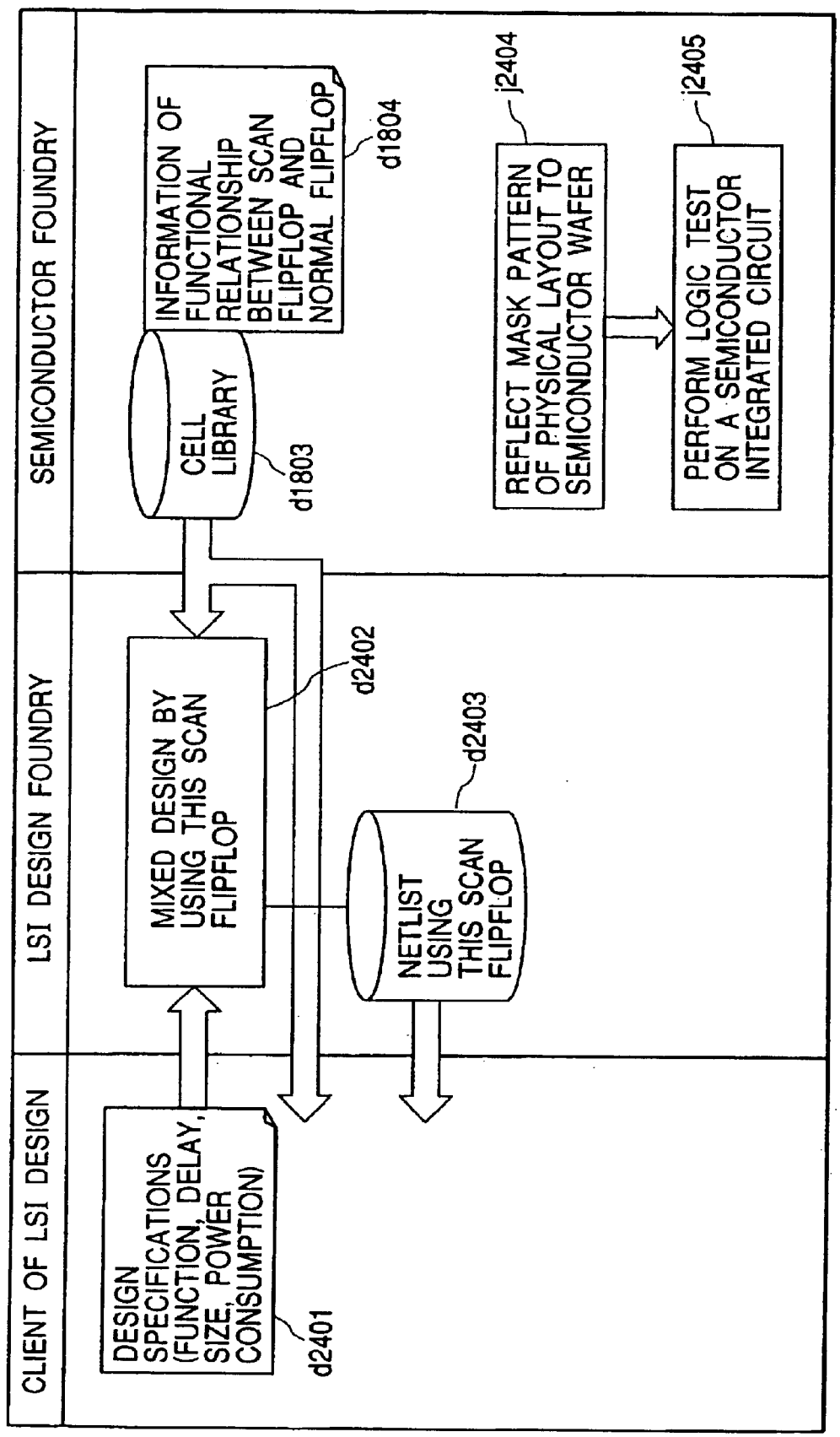
FIG. 17 is a diagram showing a design flow of the semiconductor integrated circuit of the present invention.

FIG. 17 is a diagram showing a flow for designing a semiconductor integrated circuit to which the present invention is applied. In this flow, an LSI design foundry implements the design in which the normal scan FF and the scan FF of the present invention are mixed (hereinafter, referred to as "mixed design by using this scan flipflop"). In the present embodiment, a client of LSI design provides the LSI design foundry with only the design specifications. In this diagram, the black thick line indicates a dependence relationship between the processing and the information, and the arrow of white blank indicates the flow of the information. Specifically, the LSI design foundry implements the mixed design by using this scan flipflop d2402 by using a design specifications d2401 provided by the client of LSI design, the cell library d1803 provided by a semiconductor foundry (performs the manufacture of the designed semiconductor integrated circuit), and the information of functional relationship between scan flipflop and normal flipflop d1804. Ultimately, the LSI design foundry prepares a gate-level netlist (hereinafter, referred to as "netlist using this scan flipflop") d2403. The prepared gate-level netlist d2403 is passed to the client of LSI design. In this respect, there will be a case where the cell library d1803 is also passed to the client of LSI design.

Figure 18:
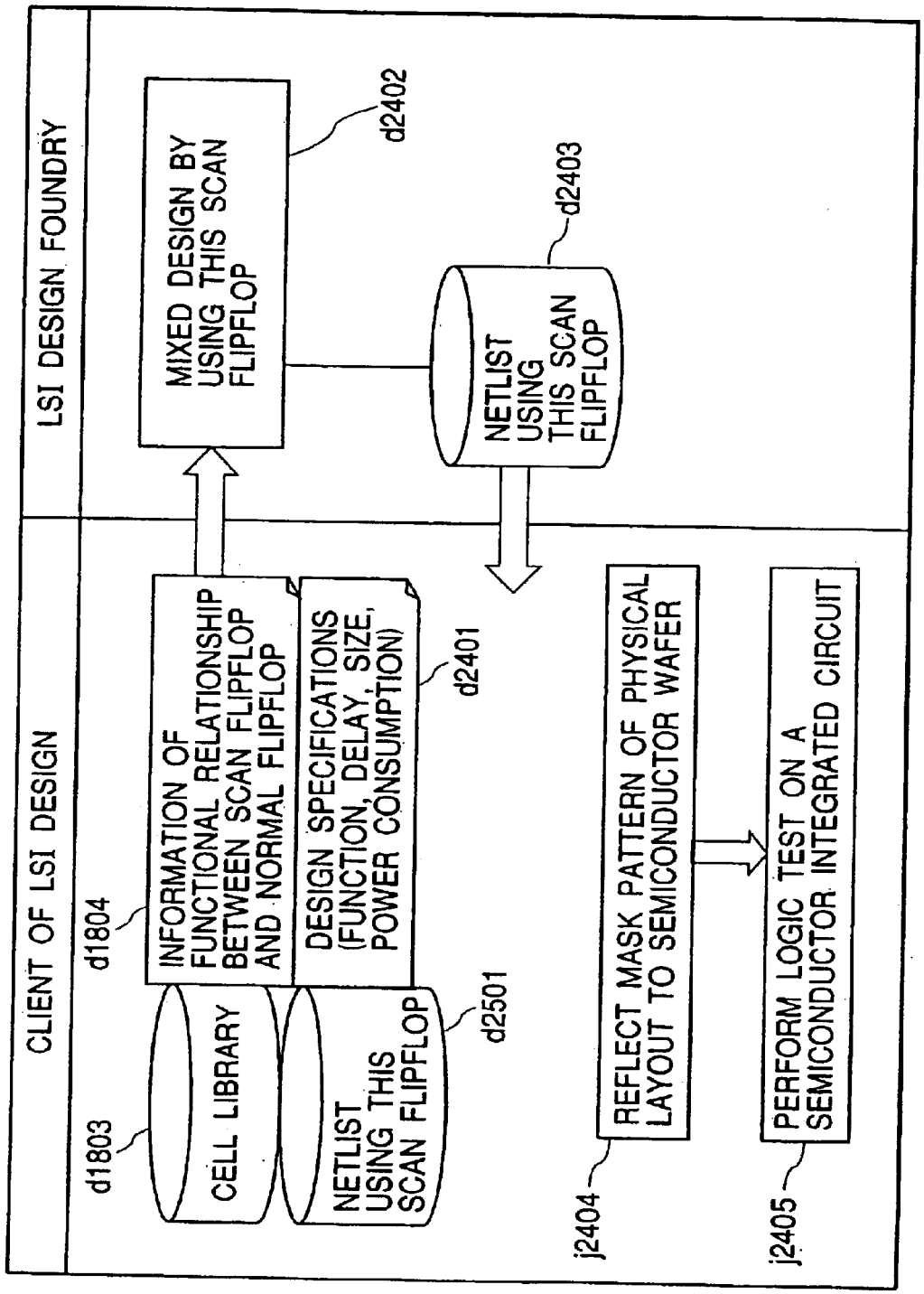
FIG. 18 is a diagram showing a design flow of the semiconductor integrated circuit according to the present invention.

FIG. 18 shows an example in which the LSI design foundry implements the mixed design by using this scan flipflop. In this embodiment, there is shown a handling in which the client of LSI design (also performs the manufacture of the designed semiconductor integrated circuit) provides the LSI design foundry with not only the design specifications but also the cell library, and the gate-level netlist. In this diagram, the black thick line indicates the dependence relationship between the processing and the information, and the arrow of white blank indicates the flow of the information. Specifically, the LSI design foundry implements the mixed design by using this scan flipflop d2402 by using the design specifications d2401, the cell library d1803, the information of functional relationship between scan flipflop and normal flipflop d1804 and the gate-level netlist not using the scan FF of the present invention (hereinafter, referred to as "netlist without this scan FF") d2501 all of which are provided by the client of LSI design. Ultimately, the LSI design foundry prepares the netlist using this scan FF d2403. Thereafter, the netlist d2403 is passed to the client of LSI design.

The semiconductor foundry (FIG. 17) or the client of LSI design (FIG. 18) reflects the mask pattern of physical layout prepared from the netlist to a semiconductor wafer (j2404). The logic test is performed on a semiconductor integrated circuit apparatus prepared after being reflected with the mask pattern of physical layout (j2405). Here, at logic test, the same frequency can be used for the scan-in operation, the logic test operation and the scan-out operation. In particular, it is desirable to use the same frequency as the clock frequency at normal operation. With respect to the user logic circuit portion using the normal scan FF, there is a problem of the heat generation and the like due to the rise of the operating probability. However, since it is possible to make such a portion occupy a very small portion in the semiconductor integrated circuit, no drawback is caused due to the semiconductor integrated circuit apparatus.

Figure 19:
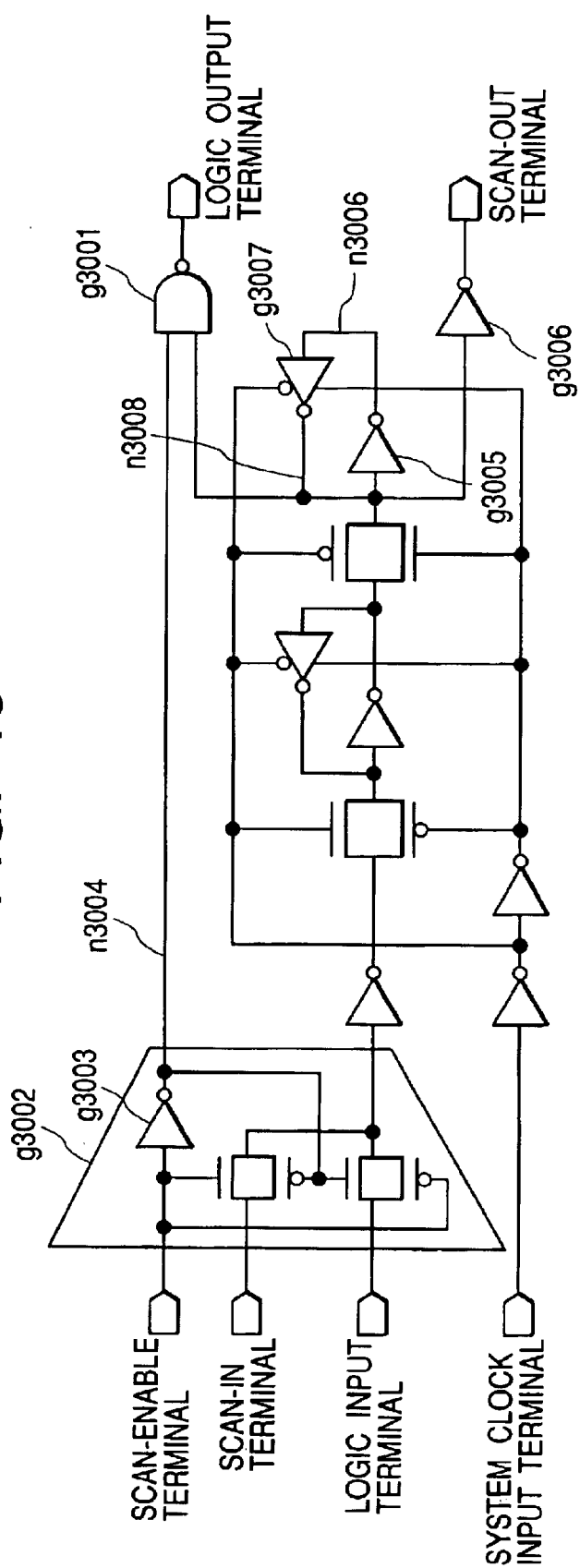
FIG. 19 is a circuit configuration diagram showing a semiconductor integrated circuit according to the ninth embodiment of the present invention.

FIG. 19 is a circuit configuration diagram showing a semiconductor integrated circuit according to the ninth embodiment of the present invention. This is an example in which the 2-input NOR gate for fixing the output signal to logic circuit described in the second embodiment is replaced with a 2-input NAND gate g3001. Such a replacement is enabled by inputting an output signal line n3004 of an inverter g3003 used in a selector g3002 which changes over between the logic input signal and the scan input signal, into the logic gate for fixing the output signal to logic circuit g3001. In this configuration, the size of the transistor forming the scan FF can be made smaller as compared with the second embodiment. This is because that in the NOR gate and the NAND gate having the same drivability (current supplying capability), generally, the constituting transistor has a smaller size in the NAND gate. Furthermore, the chip area reducing effect and the power consumption reducing effect can be expected.

Figure 20:
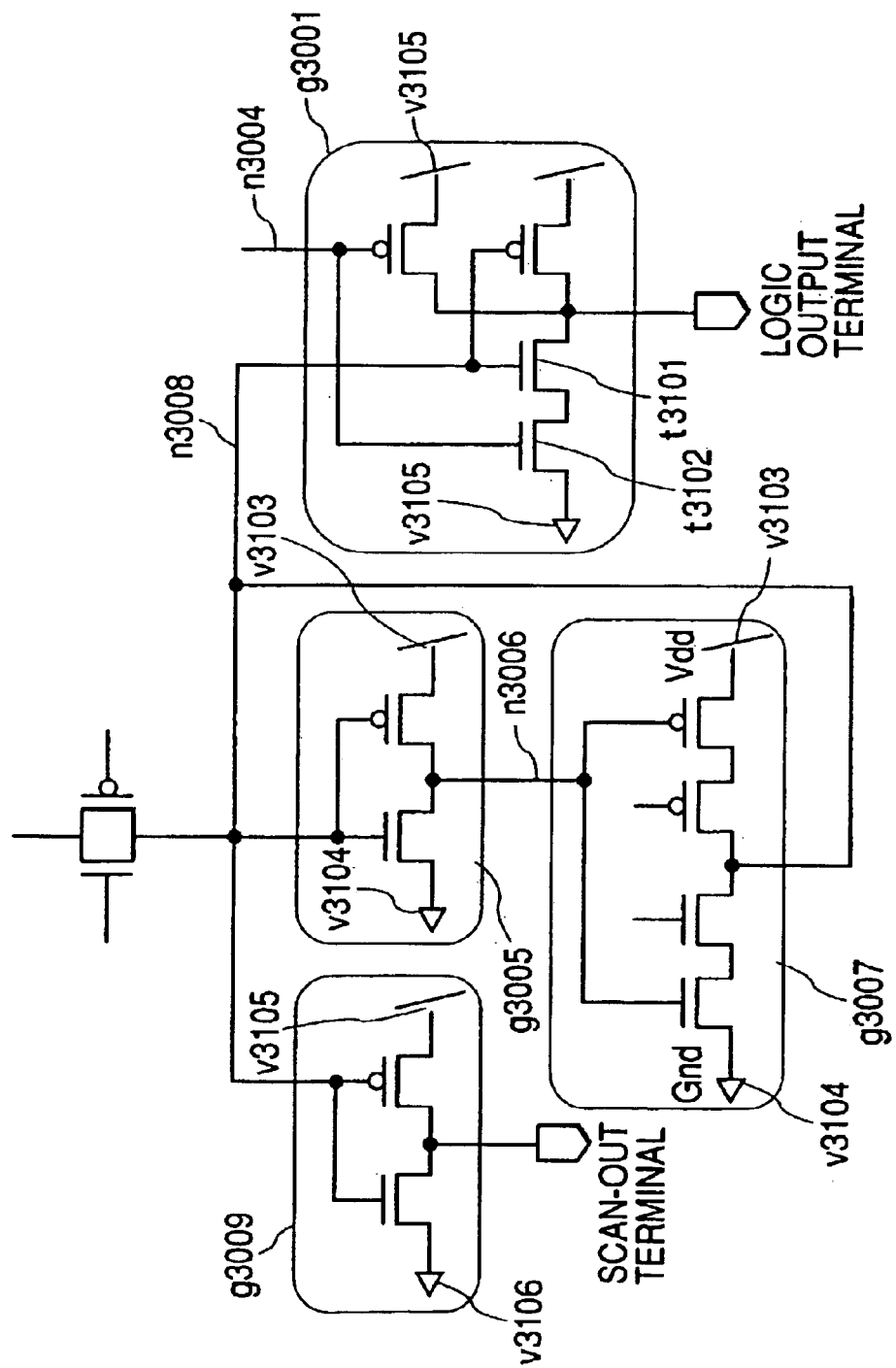
FIG. 20 is a circuit configuration diagram showing a semiconductor integrated circuit at a transistor level according to the ninth embodiment of the present invention.

FIG. 20 is a circuit configuration diagram at the transistor level of the semiconductor integrated circuit shown in FIG. 19. This is an example in which the logic gate for fixing the output signal to logic circuit g3001, the inverter gate g3005, the tri-state gate g3007 and the inverter gate for scan-out g3009 are constituted using transistors. In this configuration, a logic output signal line n3008 is connected to a gate terminal of a transistor t3101 which constitutes the logic gate for fixing the output signal to logic circuit g3001, and a drain terminal of which is connected to the logic output terminal. When configured in this manner, the delay time required for the logic signal output can be reduced as compared with the case where the logic output signal line n3008 is connected to a gate terminal of a transistor t3102 whose drain terminal is not connected to the logic output terminal.

Figure 21:
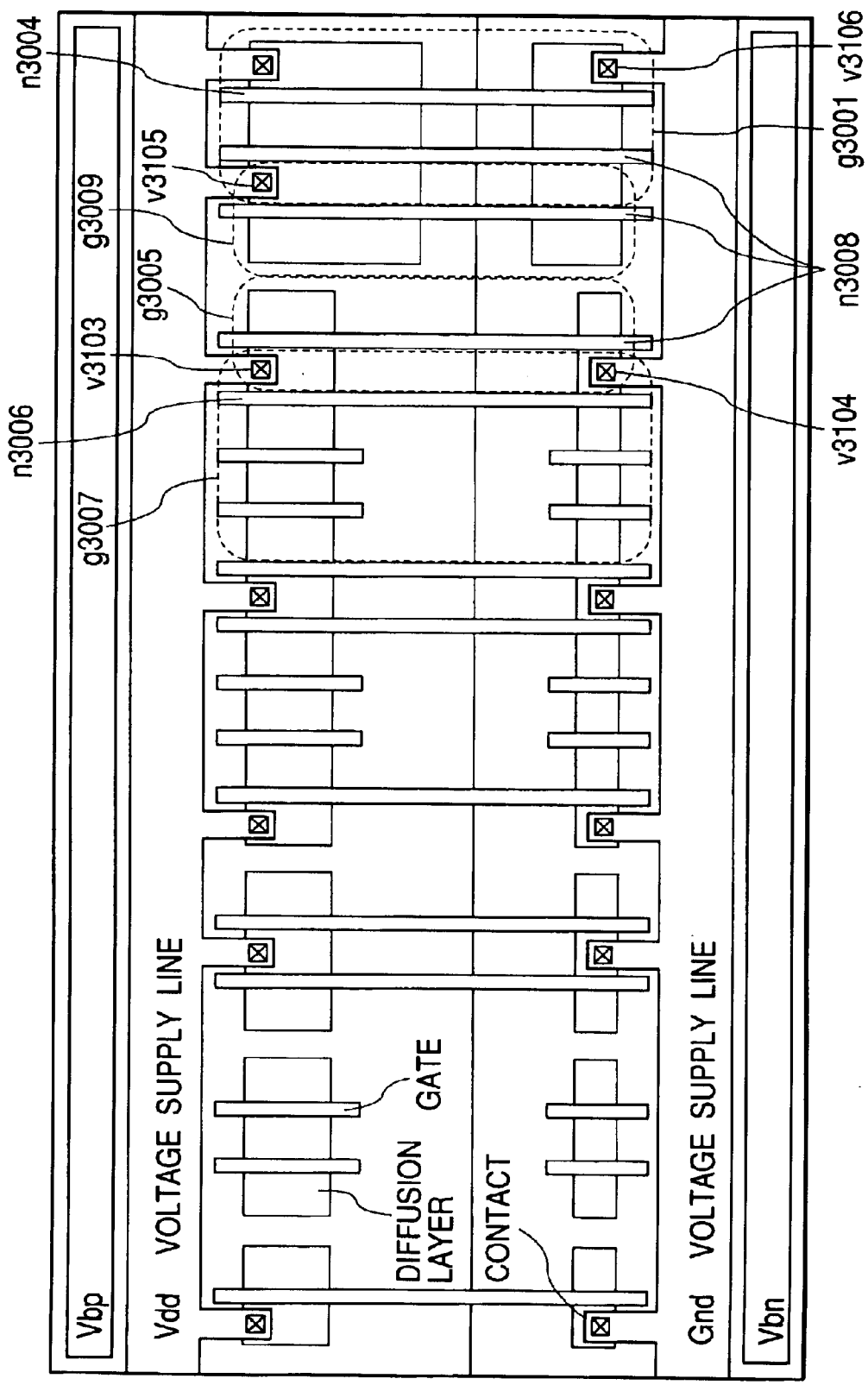
FIG. 21 is a plan view of a layout of a semiconductor integrated circuit in the circuit shown in FIG. 20.
Figure 22:
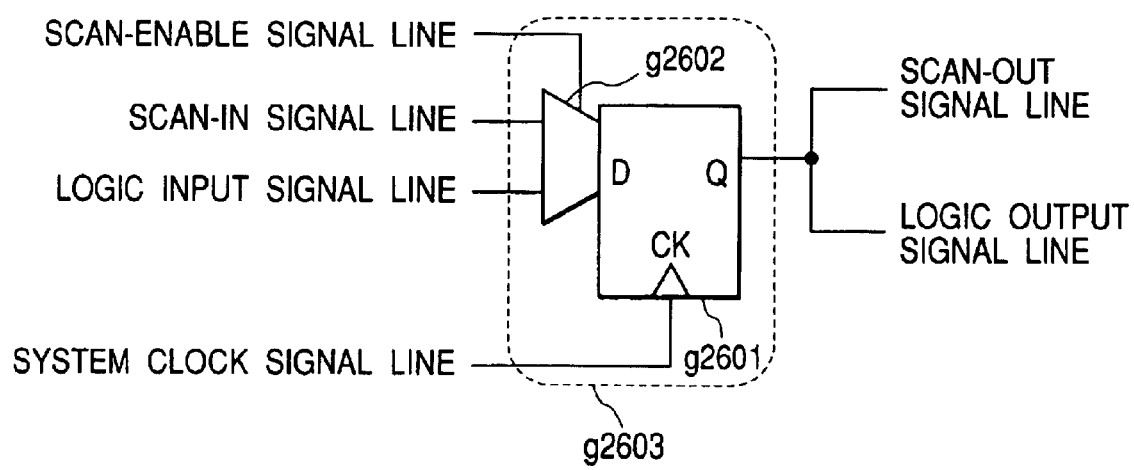
FIG. 22 is a circuit configuration diagram showing a scan flipflop used in the conventional technique.
Figure 23:
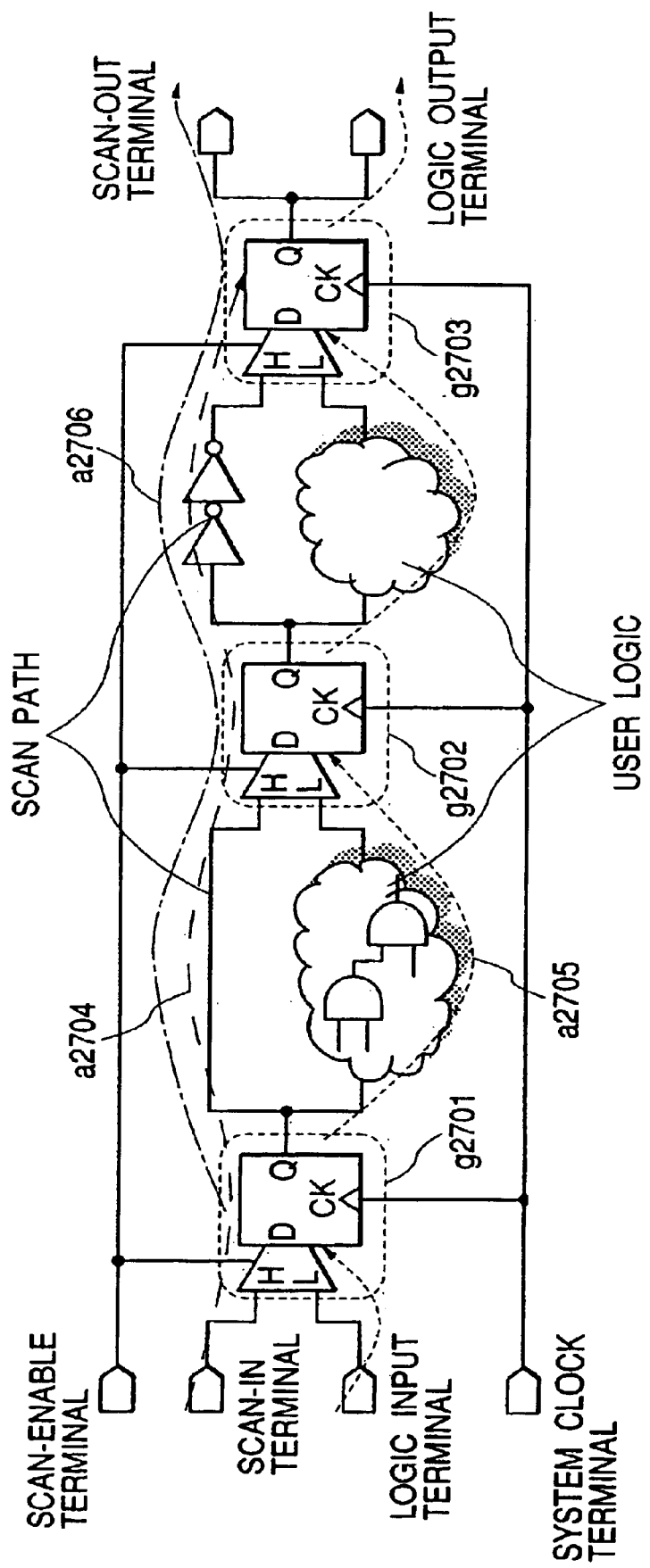
FIG. 23 is a diagram showing a logic circuit scanned by the conventional technique.

FIG. 21 shows a layout example of the scan FF explained in FIG. 20. For the sake of easy understanding of the drawing, only a voltage supply line, a diffusion layer and a poly-silicon gate layer are shown, and a connecting line between the poly-silicon gate layer and the diffusion layer is omitted. In this configuration, as to the inverter gate g3005 and the tri-state gate g3007, a Vdd voltage supply line v3103 and a Gnd voltage supply line v3104 are made to be shared. Likewise, as to the logic circuit g3001 and the inverter gate for scan-out g3009, a Vdd voltage supply line v3105 and a Gnd voltage supply line v3106 are made to be shared. When configured in this manner, since the width of the diffusion layer can be made smaller, the reduction of the chip area can be achieved.

As described in the foregoing, according to the present invention, it is possible to reduce the test cost by decreasing the test time and suppressing the increase of the chip area as compared with the conventional technique.

What is claimed is:

1. A storage circuit comprising:
   a first logic gate for receiving a first signal and a second signal, and for selectively outputting either the first signal or the second signal in accordance with a control signal;
   a first storage element for receiving a clock signal, for storing an output signal of the first logic gate in response to the clock signal, and for outputting the stored signal as a third signal in response to the clock signal; and
   a second logic gate for receiving the third signal from the first storage element, said second logic gate fixing an output signal thereof, regardless of the received third signal, in response to the control signal;
   wherein the storage circuit, having a first output and a second output, outputs the third signal directly to the first output, and the output signal of the second logic gate through the second output.

2. A storage circuit having first and second outputs, comprising:
   a first logic gate for receiving a first signal and a second signal, and for selectively outputting either the first signal or the second signal in accordance with a control signal;
   a first storage element, having a master latch and a slave latch, wherein the master latch inputs an output signal of the first logic gate and latches the output signal of the first logic gate in response to the clock signal, and the slave latch inputs an output signal of the master latch and passes the output signal of the master latch to the first output of the storage circuit in response to an inverted clock signal;
   a second logic gate which is coupled to the output of the master latch, the output signal of the master latch being received by the second logic gate without passing through the slave latch, and the second logic gate outputting the output signal of the master latch to the second output of the storage circuit in response to the control signal.

3. A storage circuit comprising:
   a first logic gate for receiving a first signal and a second signal, and for selectively outputting either the first signal or the second signal in accordance with a first control signal;

a first storage element for receiving a clock signal, for storing an output signal of the first logic gate in response to the clock signal, and for outputting the stored signal as a third signal in response to the clock signal; and a second logic gate for receiving the third signal from the first storage element, said second logic gate fixing an output signal thereof, regardless of the received third signal, in response to a second control signal which is supplied independently of the first control signal, wherein the storage circuit, having a first output and a second output, outputs the third signal through the first output, and the output signal of the second logic gate through the second output.

4. A storage circuit according to claim 3, wherein the second control signal is fixed to a low level earlier than the first control signal at a time of a transition from a scan-in operation to a logic test operation.

5. A semiconductor integrated circuit comprising:

a first storage circuit including first and second input terminals, first and second output terminals, a first control terminal for receiving a control signal, first and second logic gates, and a first storage element;

a logic circuit for receiving an output signal of the first output terminal of the first storage circuit, for performing a predetermined processing on the output signal, and for outputting a result of the processing; and a second storage circuit including third and fourth input terminals, and a second control terminal for receiving the control signal, wherein the first logic gate receives a first signal of the first input terminal and a second signal of the second input terminal, and selectively outputs either the first signal or the second signal in accordance with the control signal of the first control terminal;

wherein the first storage element receives a clock signal, stores an output signal of the first logic gate in response to the clock signal, and outputs the stored signal by way of a third signal in response to the clock signal;

wherein the second logic gate receives the third signal from the first storage element, the second logic gate fixing an output signal thereof; regardless of the received third signal, in response to the control signal of the first control terminal;

wherein the first storage circuit outputs the third signal through the first output terminal to the logic circuit, and the output signal of the second logic gate through the second output terminal to the second storage circuit; and wherein the second storage circuit receives the output signal from the first storage circuit through the third input terminal and the output signal of the logic circuit through the fourth input terminal, and selectively stores either the output signal of the logic circuit or the first storage circuit in accordance with the control signal of the second control terminal.

* * * * *